(12) United States Patent
Kim et al.

(10) Patent No.: US 8,409,947 B2
(45) Date of Patent: Apr. 2, 2013

(54) METHOD OF MANUFACTURING SEMICONDUCTOR DEVICE HAVING STRESS CREATING LAYER

(75) Inventors: Jin-bum Kim, Seoul (KR); Wook-je Kim, Gwacheon-si (KR); Yu-gyun Shin, Hwaseong-si (KR); Kwan-heum Lee, Suwon-si (KR); Sun-ghil Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 425 days.

(21) Appl. No.: 12/693,080

(22) Filed: Jan. 25, 2010

(65) Prior Publication Data

US 2010/0197092 A1 Aug. 5, 2010

(30) Foreign Application Priority Data

Feb. 2, 2009 (KR) .................. 10-2009-0008047

(51) Int. Cl.
*H01L 21/8238* (2006.01)
(52) U.S. Cl. ........ 438/229; 257/190; 257/192; 257/213; 438/285; 438/299; 438/305
(58) Field of Classification Search .................. 257/19, 257/190, 192, 213, 335, 357, 368, 383, 408; 438/257, 299, 305, 495, 644, 656, 229, 285, 438/306
See application file for complete search history.

(56) References Cited

U.S. PATENT DOCUMENTS

| 6,593,217 | B1 * | 7/2003 | Fujisawa ..................... 438/495 |
| 2004/0183137 | A1 * | 9/2004 | Kwon ........................ 257/369 |
| 2006/0220113 | A1 * | 10/2006 | Tamura et al. .............. 257/335 |
| 2007/0012913 | A1 * | 1/2007 | Ohta et al. .................. 257/19 |
| 2007/0045729 | A1 | 3/2007 | Hoentschel et al. |
| 2008/0157208 | A1 * | 7/2008 | Fischer et al. .............. 257/368 |
| 2008/0157224 | A1 | 7/2008 | Fischer et al. |

FOREIGN PATENT DOCUMENTS

JP 2008-028324 2/2008

* cited by examiner

*Primary Examiner* — Kimberly Rizkallah
*Assistant Examiner* — Errol Fernandes
(74) *Attorney, Agent, or Firm* — Myers Bigel Sibley & Sajovec, P.A.

(57) ABSTRACT

Provided is a simplified method of manufacturing a semiconductor device having a stress creating layer. A first conductive first impurity region is formed on a semiconductor substrate on both sides of a first gate of a first area of the semiconductor substrate, and a second conductive second impurity region is formed on the semiconductor substrate on both sides of a second gate of a second area. First and second spacers are formed on sidewalls of the first and second gates, respectively. First and second semiconductor layers are formed in portions of the semiconductor substrate so as to contact the first and second impurity regions, respectively. The second semiconductor layer is removed. First and second barrier layers are formed in the first and second contact holes of the insulation layer, respectively.

9 Claims, 8 Drawing Sheets

METHOD OF MANUFACTURING SEMICONDUCTOR DEVICE HAVING STRESS CREATING LAYER

REFERENCE TO PRIORITY APPLICATION

This application claims the benefit of Korean Patent Application No. 10-2009-0008047, filed Feb. 2, 2009, the contents of which is hereby incorporated herein by reference.

FIELD OF THE INVENTION

The inventive concept relates to a method of manufacturing a semiconductor device, and more particularly, to a simplified method of manufacturing a semiconductor device having a stress creating layer.

BACKGROUND

To improve channel conductivity of a transistor by increasing carrier mobility in a channel region of the transistor, strain is created in the channel region to generate tensile or compressive stress. In a channel region of a p-type metal-oxide-semiconductor (PMOS) transistor, compressive stress is generated to increase mobility of holes, and in a channel region of an n-type metal-oxide-semiconductor (NMOS) transistor, tensile stress is generated to increase mobility of electrons.

In a complementary-metal-oxide-semiconductor (CMOS) transistor, in order to form a stress creating layer in recessed source and drain areas of a PMOS transistor, a blocking layer for masking an NMOS transistor needs to be formed. Thus, a photolithography process for forming the blocking layer is required. When removing the blocking layer after forming the stress creating layer, residues exist in the blocking layer and the device characteristics of the CMOS transistor are deteriorated. Also, leakage characteristics of the NMOS transistor are deteriorated due to an etching difference occurring when forming a tensile stress creating layer in the NMOS transistor.

SUMMARY

The inventive concept provides a simplified method of manufacturing a semiconductor device having a stress creating layer.

According to an aspect of the inventive concept, there is provided a method of manufacturing a semiconductor device having a stress creating layer. First, first and second gates may be formed on first and second areas of a semiconductor substrate, respectively. A first conductive first impurity region may be formed on the semiconductor substrate on both sides of the first gate of the first area, and a second conductive second impurity region may be formed on the semiconductor substrate on both sides of the second gate of the second area. First and second spacers may be formed on sidewalls of the first and second gates, respectively. First and second semiconductor layers may be formed in portions of the semiconductor substrate to contact the first and second impurity regions, respectively. An insulation layer may be formed on the semiconductor substrate on which the first and second gates and the first and second semiconductor layers are arranged. A second contact hole that exposes the second semiconductor layer may be formed by etching the insulation layer. The second semiconductor layer that is exposed through the second contact hole may be removed. A first contact hole that exposes the first semiconductor layer may be formed by etching the insulation layer. First and second barrier layers may be formed in the first and second contact holes, respectively.

In the forming of the first and second semiconductor layers, first and second recess areas may be formed by etching the first and second impurity regions and a portion of the semiconductor substrate under the first and second impurity regions, and the first and second semiconductor layers may be formed in the first and second recess areas, respectively.

Before or after forming the first and second semiconductor layers in the first and second recess areas, a first conductivity third impurity region having a higher doping density than the first conductivity first impurity region may be formed on the semiconductor substrate on both sides of the first gate of the first area, and a second conductivity fourth impurity region having a higher doping density than the second conductivity second impurity region may be formed on the semiconductor substrate on both sides of the second gate of the second area. The first conductivity third impurity region may be formed to have a junction depth that is greater than an etching depth of the first recess area and to contact the first conductivity first impurity region, and the second conductivity fourth impurity region may be formed to have a junction depth that is greater than an etching depth of the second recess area and to contact the second conductivity second impurity region.

Before or after forming the first and second recess areas, a first conductivity third impurity region having a higher doping density than the first conductivity first impurity region may be formed on the semiconductor substrate on both sides of the first gate of the first area, and a second conductivity fourth impurity region having a higher doping density than the second conductivity second impurity region may be formed on the semiconductor substrate on both sides of the second gate of the second area. The first conductivity third impurity region may be formed to have a junction depth that is greater than an etching depth of the first recess area and to contact the first conductivity first impurity region, and the second conductivity fourth impurity region may be formed to have a junction depth that is greater than an etching depth of the second recess area and to contact the second conductivity second impurity region.

The forming of the first and second recess areas may comprise etching portions of the semiconductor substrate to have etching depths greater than junction depths of the first and second impurity regions. The etching depth of the semiconductor substrate may be 200 to 1000 Å from a surface of the semiconductor substrate.

The forming of the first and second semiconductor layers may comprise forming SiGe layers to protrude from a surface of the semiconductor substrate by 0 to 500 Å by using a selective epitaxial growth process in the first and second recess areas. The SiGe layers may include Ge at 5-40 atomic percent.

The removing of the first and second semiconductor layers may comprise etching using at least one chemical selected from the group consisting of $CH_3COOH$, HF, and $HNO_3$.

According to an aspect of the inventive concept, there is provided a method of manufacturing a semiconductor device having a stress creating layer. First, first and second gates may be formed on first and second areas of a semiconductor substrate, respectively. A first conductive first low density impurity region may be formed on the semiconductor substrate on both sides of the first gate of the first area, and a second conductive second low density impurity region may be formed on the semiconductor substrate on both sides of the second gate of the second area. First and second spacers may be formed on sidewalls of the first and second gates, respectively. First and second recess areas may be formed by etching the first and second low density impurity regions and portions of the semiconductor substrate below the first and second low density impurity regions by a predetermined thickness from a surface of the semiconductor substrate. A first stress creating layer may be formed in the first and second recess areas. An insulation layer may be formed on the semiconductor substrate on which the first and second gates and the first stress creating layer. A second contact hole that exposes the first stress creating layer arranged in the second area may be formed by etching the insulation layer. The second recess area of the semiconductor substrate may be exposed by removing the first stress creating layer arranged in the second area exposed through the second contact hole. A first contact hole that exposes the first stress creating layer remaining in the first area may be formed by etching the insulation layer. A second stress creating layer may be formed in the first and second contact holes. The second stress creating layer may be arranged in the first contact hole on the remaining first stress creating layer, and the second stress creating layer may be arranged in the second contact hole on the semiconductor substrate in the second recess area.

A first conductivity first high density impurity region contacting the first low density impurity region may be further formed on the semiconductor substrate on both sides of the first gate of the first area, and a second conductivity second high density impurity region contacting the second low density impurity region may be further formed on the semiconductor substrate on both sides of the second gate of the second area. At least one of the group consisting of the first and second high density impurity regions may be formed before or after forming the first and second recess areas or before or after forming the first stress creating layer. The first high density impurity region may be formed in the first recess area to surround the remaining first stress creating layer, and the second high density impurity region may be formed in the second recess area under the second stress creating layer.

DETAILED DESCRIPTION OF THE EMBODIMENTS

Figure 1:
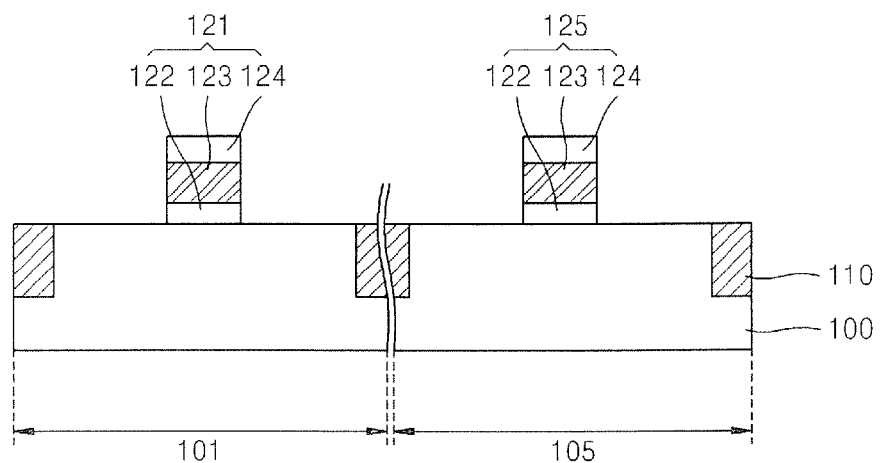
FIGS. 1 through 10 are cross-sectional views illustrating a method of manufacturing a semiconductor device according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. In the drawings, the forms of elements are exaggerated for clarity. Like reference numerals in the drawings denote like elements.

FIGS. 1 through 10 are cross-sectional views illustrating a method of manufacturing a semiconductor device according to an embodiment of the inventive concept.

Referring to FIG. 1, a semiconductor substrate 100 may include a first area 101 in which a p-type metal-oxide-semiconductor (PMOS) transistor is to be formed and a second area 105 in which an n-type metal-oxide-semiconductor (NMOS) transistor is to be formed. A device isolation layer 110 defining an active region of the first area 101 and an active region of the second area 105 may be formed. The device isolation layer 110 may include a trench type device isolation layer (shallow trench isolation, STI). N-type well (not shown) may be arranged in the first area 101 of the semiconductor substrate 100, and p-type well (not shown) may be arranged in the second area 105. A first gate 121 of the PMOS transistor and a second gate 125 of the NMOS transistor may be formed on the active region of the first area 101 and the active region of the second area 105, respectively.

The first and second gates 121 and 125 each may include a gate insulation layer 122 formed on each of the first and second areas 101 and 105, and a gate electrode material 123 and a capping layer 124 disposed on the gate insulation layer 122. The gate electrode material 123 may include a poly silicon layer or a stack layer formed of a poly silicon layer and a metal layer or a polysilicon layer and a metal silicide layer.

Figure 2:
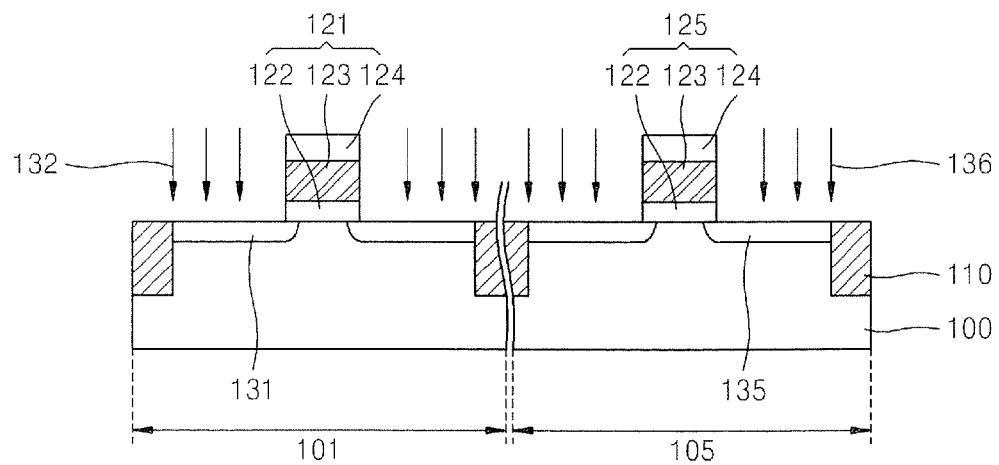

Referring to FIG. 2, a photosensitive layer (not shown) may be formed on the semiconductor substrate 100 of the second area 105 and the second gate 125. By ion-implanting the semiconductor substrate 100 of the first area 101 with P-type low density impurities 132 by using the first photosensitive layer as a mask, a first low density impurity region 131 may be formed in the first area 101 on both sides of the first gate 121. Then the photosensitive layer may be removed.

Next, a photosensitive layer (not shown) may be formed on the semiconductor substrate 100 of the first area 101 and the first gate 121. By ion-implanting the semiconductor substrate 100 of the second area 105 with n-type low density impurities 136 by using the second photosensitive layer as a mask, a second low density impurity region 135 may be formed in the second area 105 on both sides of the second gate 125. Then, the photosensitive layer may be removed. The first low density impurity region 131 may be formed in the first area 101 after forming the second low density impurity region 135 in the second area 105.

Figure 3:
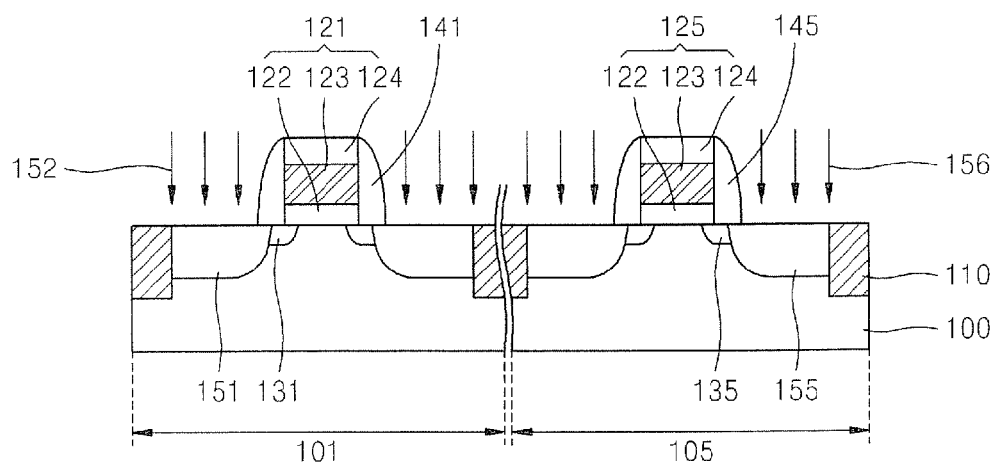

Referring to FIG. 3, a spacer material may be deposited on the semiconductor substrate 100 including the first and second gates 121 and 125. A first spacer 141 may be formed on sidewalls of the first gate 121 and a second spacer 145 may be formed on sidewalls of the second gate 125 by etch-backing the spacer material. The first and second spacers 141 and 145 may include a nitride layer.

A photosensitive layer (not shown) may be formed on the semiconductor substrate of the second area 105 so as to expose the semiconductor substrate 100 of the first area 101. By ion-implanting the semiconductor substrate 100 of the first area 101 with p-type high density impurities 152 by using the photosensitive layer as a mask, a first high density impurity region 151 may be formed in the first area 101 on both sides of the first gate 121. Accordingly, a source/drain region having a lightly doped drain (LDD) structure of a PMOS transistor may be formed. Then the photosensitive layer may be removed.

Next, a photosensitive layer (not shown) is formed on the semiconductor substrate 100 of the first area 101 such that the semiconductor substrate 100 of the second area 105 is exposed. By ion-implanting the semiconductor substrate 100 of the second area 105 with n-type high density impurities 156 by using the photosensitive layer as a mask, a second high density impurity region 155 may be formed in the second area 105 on both sides of the second gate 125. Accordingly, a source/drain region having an LDD structure of an NMOS transistor may be formed. Then the photosensitive layer may be removed. The first high density impurity region 151 may be formed on the first area 101 after forming the second high density impurity region 155 on the second area 105.

Figure 4:
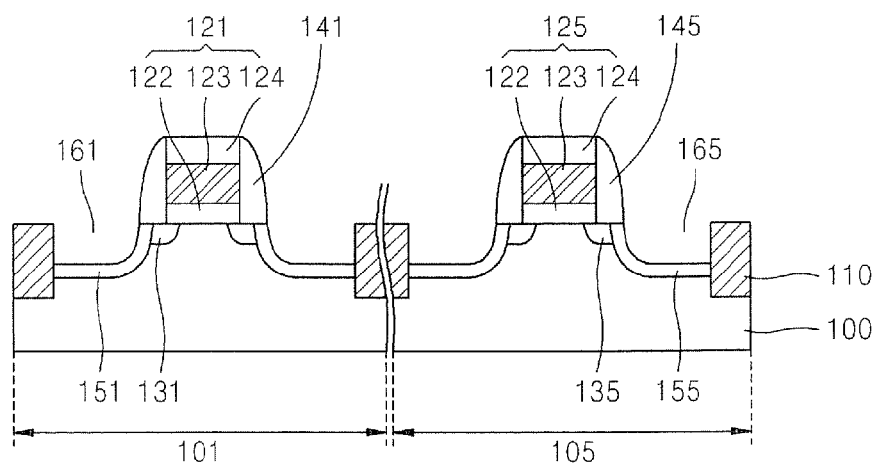

Referring to FIG. 4, the semiconductor substrate 100 of the first and second areas 101 and 105 may be anisotropically etched to a predetermined etching depth from a surface of the semiconductor substrate 100 to form first and second recess areas 161 and 165. The first recess area 161 may be arranged in the first high density impurity region 151, and the second recess area 165 may be arranged in the second high density impurity region 155.

The first recess area 161 may have an etching depth that is smaller than a junction depth of the first high density impurity region 151 and greater than a junction depth of the first low density impurity region 131. The second recess area 165 may have an etching depth that is smaller than a junction depth of the second high density impurity region 155 and greater than a junction depth of the second low density impurity region 135. The first and second recess areas 161 and 165 may have an etching depth of 200-1000 Å.

Figure 5:
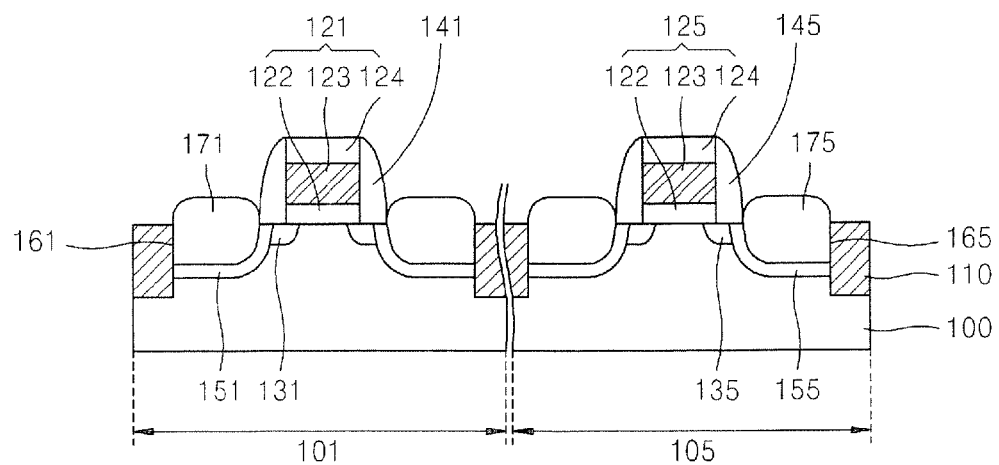

Referring to FIG. 5, first and second stress creating layers 171 and 175 may be formed in the first and second recess areas 161 and 165, respectively. The first stress creating layer 171 may be formed such that lower and side surfaces of the first stress creating layer 171 are surrounded by the first high density impurity region 151, and the second stress creating layer 175 may be formed such that lower and side surfaces of the second stress creating layer 175 are surrounded by the second high density impurity region 155.

The first and second stress creating layers 171 and 175 may include a SiGe layer which is formed using a selective epitaxial growth process. The first and second stress creating layers 171 and 175 may include SiGe layers containing germanium at 5-40 atomic percent. The first and second stress creating layers 171 and 175 may be formed to protrude from the surface of the semiconductor substrate 100 at a predetermined height. The first and second stress creating layers 171 and 175 may have a protrusion height of 0-500 Å from the surface of the semiconductor substrate 100.

Figure 6:
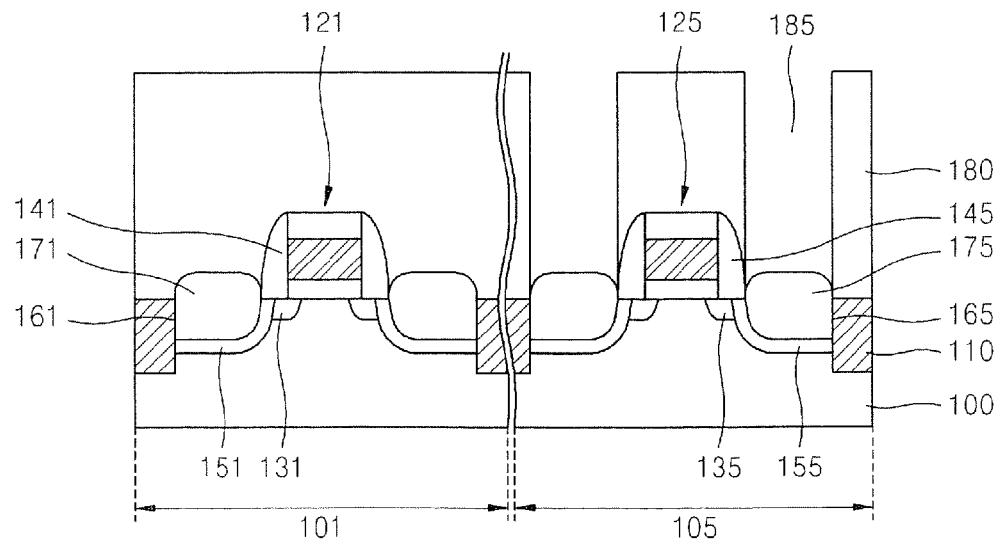

Referring to FIG. 6, an insulation layer 180 may be formed on the semiconductor substrate 100. The insulation layer 180 may include an interlayer insulation layer. A photosensitive layer (not shown) may be formed on the insulation layer 180 to expose a portion of the insulation layer 180 corresponding to the second stress creating layer 175. The exposed portion of the insulation layer 180 may be etched using the photosensitive layer as an etch mask to form a second contact hole 185. The second contact hole 185 may be formed to expose the second stress creating layer 175. Then the photosensitive layer may be removed.

According to another embodiment of the inventive concept, one of the first and second high density impurity regions 151 and 155 may be formed before forming the first and second recess areas 161 and 165 or after forming the first and second stress creating layers 171 and 175.

Figure 7:
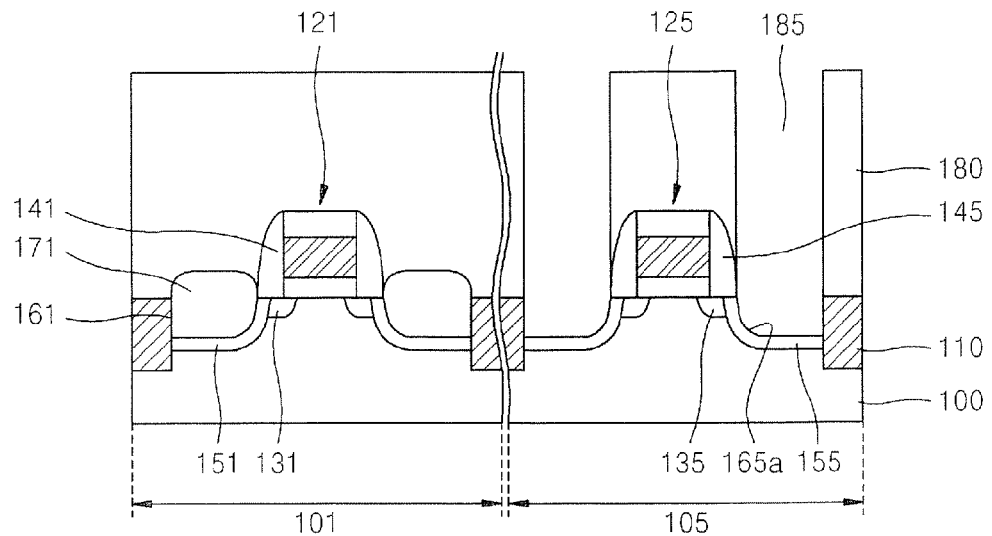

Referring to FIG. 7, the exposed second stress creating layer 175 may be removed. The second high density impurity region 155 may be exposed through the second contact hole 185. The second stress creating layer 175 may be removed by using a chemical including one of $CH_3COOH$, HF, and $HNO_3$ or a combination of these. As the second stress creating layer 175 may be removed, a second recess area 165a is arranged on the second high density impurity region 155.

Figure 8:
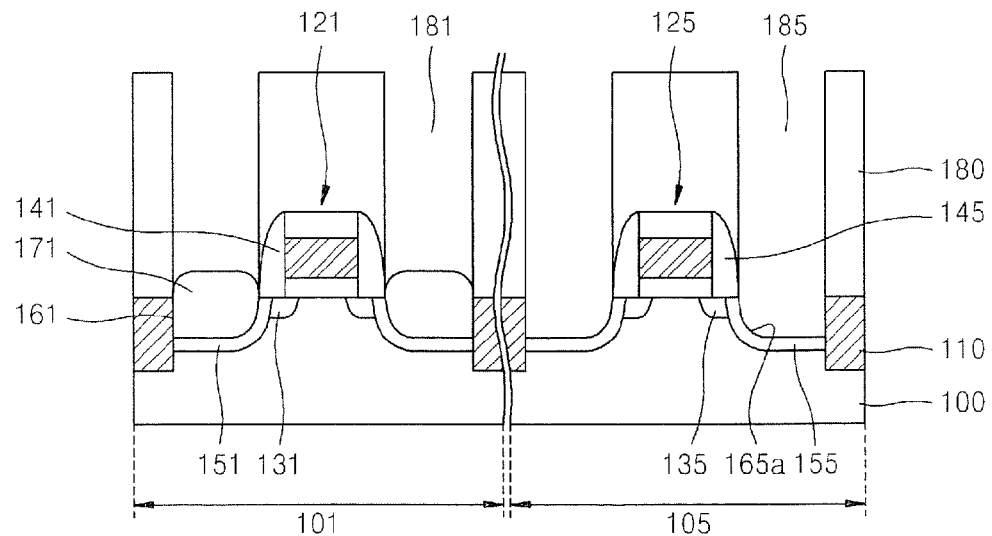

Referring to FIG. 8, a photosensitive layer (not shown) may be formed on the insulation layer 180 such that a portion of the insulation layer 180 corresponding to the first stress creating layer 171 is exposed. The exposed portion of the insulation layer 180 may be etched by using the photosensitive layer as an etch mask to form a first contact hole 181. The first contact hole 181 may be formed such that the first stress creating layer 171 is exposed. Then the photosensitive layer may be removed.

Figure 9:
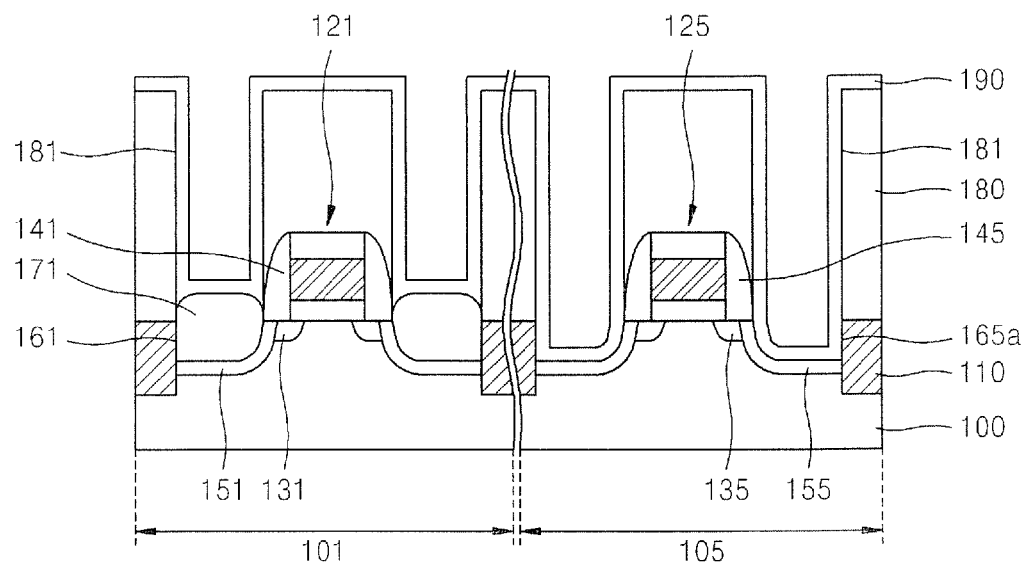

Referring to FIG. 9, a barrier layer 190 may be formed over the first and second contact holes 181 and 185 and the insulation layer 180. The barrier layer 190 may be arranged on the first stress creating layer 171 in the first contact hole 181. The barrier layer 190 may be arranged on the second recess area 165a in the second contact hole 185 and contact the second high voltage impurity region 155. Accordingly, compressive stress may be generated by the first stress creating layer 171 in a channel region of the PMOS transistor, and tensile stress may be generated by the barrier layer 190 in a channel region of the NMOS transistor. The barrier 190 may include TiN or TaN.

Figure 10:
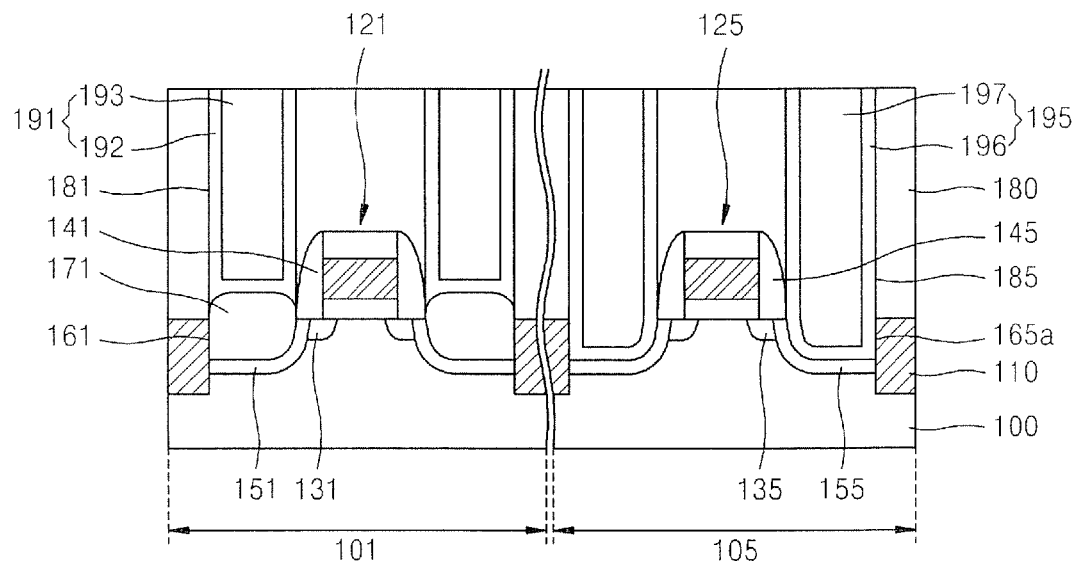

Referring to FIG. 10, a conductive layer 193 (not shown) may be formed on the barrier layer 190 so as be filled with the first and second contact holes 181 and 185, respectively. The conductive layer may include a tungsten layer. By etching the conductive layer and the barrier layer 190, a first contact plug 191 may be formed in the first contact hole 181 and a second contact plug 195 may be formed in the second contact hole 185. The first and second contact plugs 191 and 195 may include the barrier layer 190 and each of the conductive layers 193 and 197.

Figure 11:
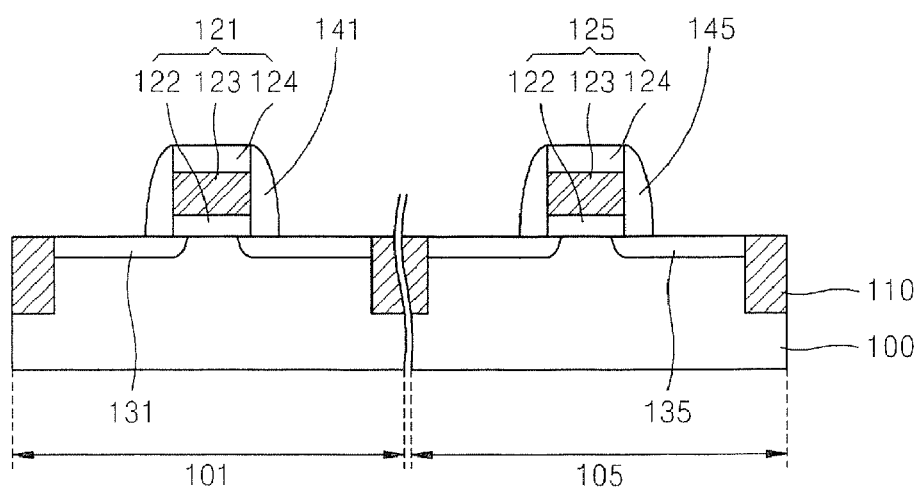
FIGS. 11 through 13 are cross-sectional views illustrating a method of manufacturing a semiconductor device according to another embodiment of the inventive concept.
Figure 12:
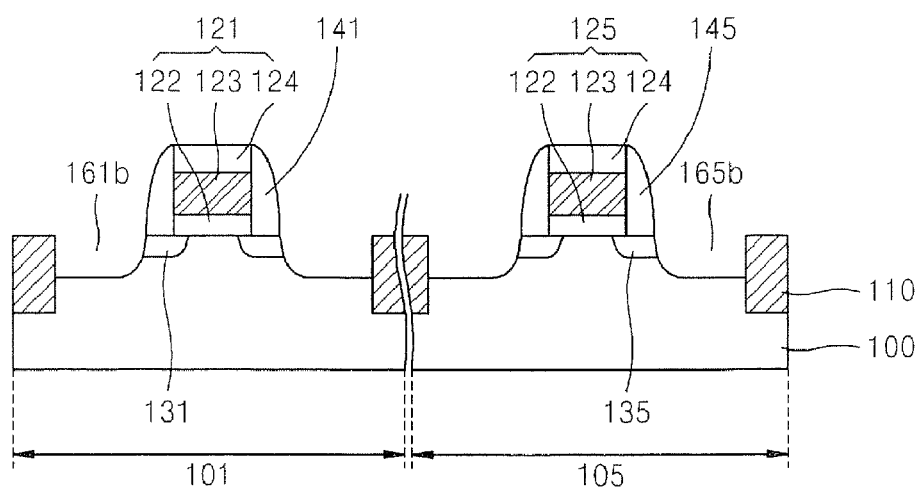
Figure 13:
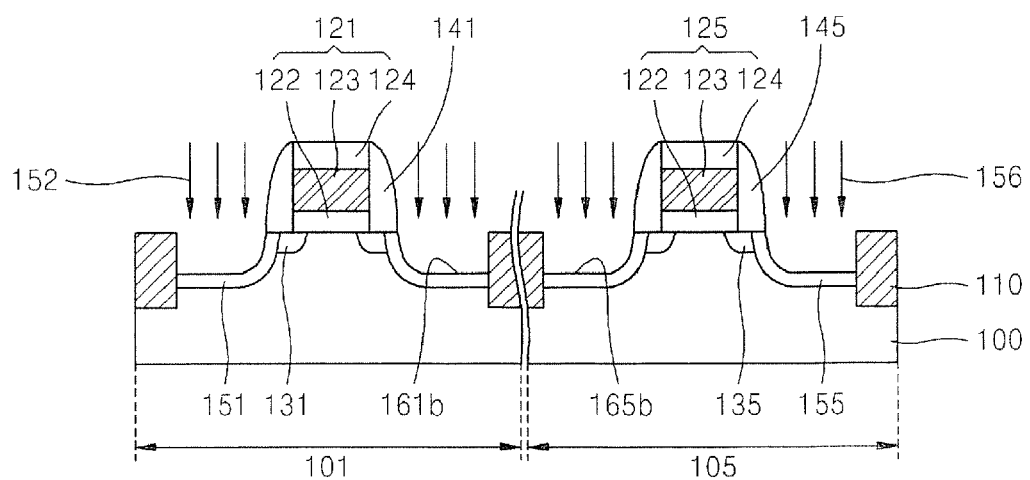

FIGS. 11 through 13 are cross-sectional views illustrating a method of manufacturing a semiconductor device according to another embodiment of the inventive concept.

Referring to FIG. 11, a device isolation layer 110 defining active regions of first and second areas 101 and 105 of a semiconductor substrate 100 may be formed, as in the embodiment of FIGS. 1 and 2. Then, first and second gates 121 and 125 may be formed on the active regions of the first and second areas 101 and 105, respectively, and first and second low density source/drain regions 131 and 135 may be formed respectively in the first and second areas 101 and 105 on both sides of the first and second gates 121 and 125. Also, first and second spacers 141 and 145 may be formed on sidewalls of the first and second gates 121 and 125, respectively.

Referring to FIG. 12, the semiconductor substrate 100 on both sides of the first and second gates 121 and 125 may be etched to form first and second recess areas 161b and 165b. The first recess area 161b may be formed so as to expose a side portion of the first low density impurity region 131. The first recess area 161b may have an etching depth that is deeper than a junction depth of the first low density impurity regions 131. The second recess area 165b may be formed so as to expose a side portion of the second low density impurity region 135. The second recess area 165b may have an etching depth that is deeper than a junction depth of the second low density impurity regions 135.

Referring to FIG. 13, a photosensitive layer (not shown) may be formed on the semiconductor substrate 100 of the second area 105 and the second gate 125 to expose the first recess area 161b. By ion-implanting the semiconductor substrate 100, which is exposed by the first recess area 161b, with p-type high density impurities 152, by using the photosensitive layer as a mask, a first high density impurity region 151 may be formed. Accordingly, a source/drain region having an LDD structure of a PMOS transistor may be formed. Then the photosensitive layer may be removed.

Then, a photosensitive layer (not shown) may be formed on the semiconductor substrate 100 of the first area 101 and the first gate 121. By ion-implanting the semiconductor substrate 100, which is exposed by the second recess area 165b, with n-type high density impurities 156, by using the photosensitive layer as a mask, a second high density impurity region 155 may be formed. Accordingly, a source/drain region having an LDD structure of a PMOS transistor may be formed. Then the photosensitive layer may be removed.

The first high density impurity region 151 may be arranged under the first recess area 161b and contact the first low density impurity region 131, and the second high density impurity region 155 may be arranged under the second recess area 165b and contact the second low density impurity region 135. The first high density impurity region 151 may be formed to have a junction depth that is greater than an etching depth of the first recess area 161b, and the second high density impurity region 155 may be formed to have a junction depth that is greater than an etching depth of the second recess area 165b.

Then, first and second stress creating layers 171 and 175 may be respectively formed in the first and second recess areas 161b and 165b as in the embodiment described with reference to FIG. 5. Subsequent processes may be performed as described with reference to FIGS. 6 through 10.

According to another embodiment of the inventive concept, one of the first and second high density impurity regions 151 and 155 may be formed before forming the first and second recess areas 161b and 165b or after forming the first and second stress creating layers 171 and 175.

Figure 14:
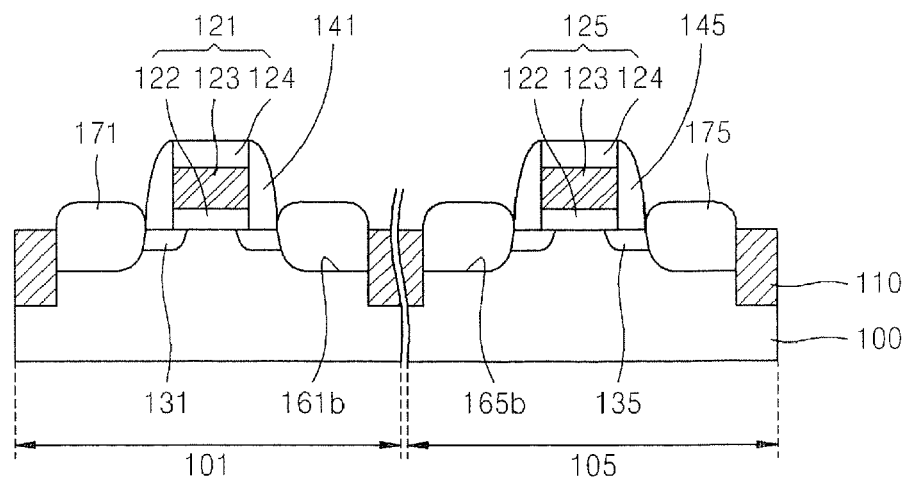
FIGS. 14 and 15 are cross-sectional views illustrating a method of manufacturing a semiconductor device according to another embodiment of the inventive concept.
Figure 15:
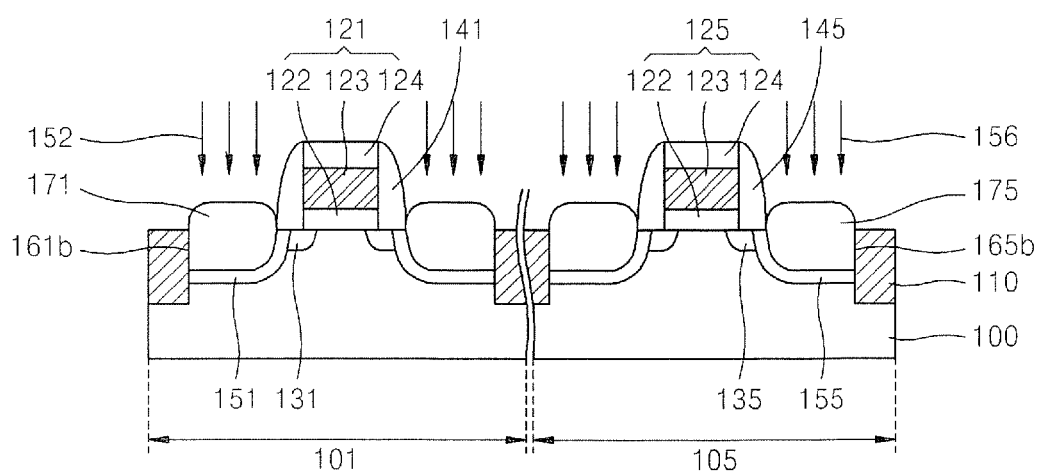

FIGS. 14 and 15 are cross-sectional views illustrating a method of manufacturing a semiconductor device according to another embodiment of the inventive concept.

Referring to FIG. 14, a device isolation layer 110 defining active regions of first and second areas 101 and 105 of a semiconductor substrate 100 may be formed, as in the embodiment of FIGS. 11 and 12. Then, first and second gates 121 and 125 may be respectively formed on the active regions of the first and second areas 101 and 105, and first and second low density source/drain regions 131 and 135 may be respectively formed in the first and second areas 101 and 105 on both sides of the first and second gates 121 and 125. Also, first and second spacers 141 and 145 may be respectively formed on both sides of the first and second gates 121 and 125.

Then, the first and second low density impurity regions 131 and 135 exposed by forming the first and second spacers 141 and 145 and the semiconductor substrate 100 below the first and second low density impurity regions 131 and 135 may be etched to form first and second recess areas 161b and 165b. Then, first and second stress creating layers 171 and 175 are formed in the first and second recess areas 161b and 165b, respectively. The first and second stress creating layers 171 and 175 may include SiGe which is formed by a selective epitaxial growth process.

Referring to FIG. 15, a photosensitive layer (not shown) may be formed on the semiconductor substrate 100 of the second area 105 and the second gate 125 such that the first stress creating layer 171 is exposed. By ion-implanting the semiconductor substrate 100, which is exposed by the first recess area 161b, with p-type high density impurities 152, by using the photosensitive layer as a mask, a first high density impurity region 151 may be formed. The first high density impurity region 151 may be formed under the first stress creating layer 171 and have a junction depth that is greater than an etching depth of the first recess area 161b. Accordingly, a source/drain region having an LDD structure of a PMOS transistor may be formed. Then the photosensitive layer may be removed.

Then, a photosensitive layer (not shown) is formed on the semiconductor substrate 100 of the first area 101 and the first gate 121 such that the semiconductor substrate 100 of the second area 105 is exposed. By ion-implanting the semiconductor substrate 100, which is exposed by the second recess area 165b, with n-type high density impurities 156 by using the photosensitive layer as a mask, a second high density impurity region 155 may be formed. The second high density impurity region 155 may be formed under the second stress creating layer 175 and have a junction depth that is greater than an etching depth of the second recess area 165b. Accordingly, a source/drain region having an LDD structure of an NMOS transistor may be formed. Then, the photosensitive layer may be removed.

Subsequent processes may be performed in the same manner as described above with reference to FIGS. 6 through 10.

While the inventive concept has been particularly shown and described with reference to exemplary embodiments thereof, it will be understood that various changes in form and details may be made therein without departing from the spirit and scope of the following claims.

What is claimed is:

1. A method of forming an integrated circuit device, comprising:
    forming an insulated gate electrode of a NMOS transistor on a substrate;
    selectively etching the substrate to define source and drain recesses therein;
    forming sacrificial stress regions in the source and drain recesses; then
    removing all of the sacrificial stress regions from within the source and drain recesses to thereby expose the source and drain recesses; and then
    forming electrically conductive source and drain plugs in the source and drain recesses, respectively.

2. The method of claim 1, wherein said forming sacrificial stress regions comprises growing silicon germanium (SiGe) stress regions in the source and drain recesses.

3. The method of claim 2, wherein said selectively etching the substrate is preceded by implanting source/drain region dopants into the substrate using the insulated gate electrode as an implant mask and then driving-in the implanted source/drain region dopants to define source and drain regions within the substrate.

4. The method of claim 3, wherein said selectively etching comprises selectively etching the source and drain regions to define source and drain recesses in the source and drain regions, respectively.

5. The method of claim 1, wherein said forming electrically conductive source and drain plugs is preceded by lining the source and drain recesses with an electrically conductive barrier layer.

6. The method of claim 5, wherein the electrically conductive barrier layer comprises a material selected from a group consisting of titanium nitride and tantalum nitride.

7. The method of claim 6, wherein the electrically conductive source and drain plugs comprise tungsten; and wherein said forming electrically conductive source and drain plugs comprises forming electrically conductive source and drain plugs on the electrically conductive barrier layer.

8. The method of claim 1, wherein said forming electically conductive source and drain plugs comprises forming source and drain plugs directly in contact with sidewalls of the source and drain recesses.

9. The method of claim 8, wherein each of the source and the drain plugs comprises a composite of a first material selected from a group consisting of titanium nitide and tungsten.

* * * * *